(12) United States Patent
Sangu et al.

(10) Patent No.: US 6,870,952 B2
(45) Date of Patent: Mar. 22, 2005

(54) POSITIONING APPARATUS USED IN A PROCESS FOR PRODUCING MULTI-LAYERED PRINTED CIRCUIT BOARD AND METHOD OF USING THE SAME (75) Inventors: Katsuya Sangu, Tokyo (JP); Ryoichi Ida, Tokyo (JP); Katsumi Momose, Tokyo (JP); Michitomo Koda, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 586 days.

(21) Appl. No.: 09/804,217

(22) Filed: Mar. 12, 2001

(65) Prior Publication Data
US 2001/0026638 A1 Oct. 4, 2001

(30) Foreign Application Priority Data
Mar. 28, 2000 (JP) ........................................ 2000-087927

(51) Int. Cl.$^7$ ........................... G06K 9/00; G01N 21/86; G01V 8/00; H04N 7/18; H04N 9/47
(52) U.S. Cl. ................. 382/151; 250/559.3; 250/492.2; 348/87; 348/95
(58) Field of Search ....................... 382/151; 250/559.3, 250/492.2; 356/401; 348/87, 95

(56) References Cited

U.S. PATENT DOCUMENTS

| | | | | |
|---|---|---|---|---|
| 3,984,680 A | * | 10/1976 | Smith | 378/34 |
| 4,346,164 A | * | 8/1982 | Tabarelli et al. | 430/311 |
| 4,504,727 A | * | 3/1985 | Melcher et al. | 219/121.62 |
| 4,614,431 A | * | 9/1986 | Komeyama | 356/401 |
| 5,028,520 A | * | 7/1991 | Ito | 430/567 |
| 5,111,406 A | * | 5/1992 | Zachman et al. | 700/160 |
| 6,256,364 B1 | * | 7/2001 | Toth et al. | 378/4 |

* cited by examiner

Primary Examiner—Bhavesh M. Mehta
Assistant Examiner—John Strege
(74) Attorney, Agent, or Firm—Nields & Lemack (57) ABSTRACT The Xray irradiation device 1 issues Xrays to board mark 7 and projects the image of the board mark 7 on the fluorescence screen 3, the fluorescence face 39 of which visibly displays the image of the board mark 7 that can be captured by the CCD camera 2. The CCD camera 2 images the board mark 7 and the mask mark 5 depicted on the photo mask 4 overlapping together. The board 6 and the photo mask 4 are aligned by exposure stage 8 so as to the board mark 7 and the mask mark 5 coincide.

16 Claims, 6 Drawing Sheets

POSITIONING APPARATUS USED IN A PROCESS FOR PRODUCING MULTI-LAYERED PRINTED CIRCUIT BOARD AND METHOD OF USING THE SAME

FIELD OF THE INVENTION

This invention relates to apparatus and method for adjusting positions in a process to produce multi-layered printed circuit boards.

BACKGROUND OF THE INVENTION AND RELATED ART STATEMENT

As electric products are becoming lighter, thinner, shorter, smaller and more functional, which is typically shown in cellular phones, a printed circuit board used in such electric products is also becoming more precise. The multi layered printed circuit board has been developed in this trend, the board is manufactured by a so-called build-up method. The multi layered printed circuit board has a core board, on both back and front faces of which resin isolation layers and conductive patterns made of copper or the like are alternately formed and laminated. The layers are conductive through a hole called a via hole that is plated by copper. The conductive patterns are formed by a lithography method using an aligner having a photo mask that is depicted with an original pattern.

When building up the layers, it is very important to adjust the positions of the layers. The new pattern on a new build up layer must be precisely formed at a certain position relevant to the old pattern on the old layer formed already. To accomplish the alignment between the new and old patterns, an alignment mark depicted on the film mask and a board mark formed on the board are utilized.

Furthermore, the position of the via hole must be precisely determined in relation to the unseen pattern formed on a lower layer.

However, the alignment mark on the core board is invisible because the layer is covered by copper foil before the pattern is formed.

OBJECTS OF THE INVENTION

In the prior art, the portion on the core board to be formed with the alignment mark is masked before coating the whole surface of the core board with a copper foil in order to avoid covering the portion with the foil. Another method is to etch the foil at the portion. However, both methods are troublesome treatments and they are sometimes a bottleneck against efficiency of the process.

Further, a hole mark formed through the board is often employed instead of the alignment mark. However, this method needs the troublesome treatment to prevent resin for forming an insulation layer entering into the hole or to remove adhered resin in the hole when forming the insulation layer.

SUMMARY OF THE INVENTION

The position adjustment of the invention includes a mark that can be imaged by xrays. The mark is formed on at least one layer of a board that is being covered by a plurality of layers. The bottom layer is the core board of the printed circuit board. The mark is irradiated with Xrays by an Xray irradiator. The mark will be imaged on a projection screen that can convert Xrays to visible rays, ultraviolet rays or infrared rays. Based on the mark, the moving apparatus moves at least one of the board or an object. The object is typically a photo mask in the process of lithographic manufacturing of the printed circuit board.

Accordingly the mark on the board can be imaged on the projection screen by Xray radiation even if it is covered by the copper foil or the like and invisible. Then the location of the board is detected by the mark and the position is easily and precisely adjusted with the object.

It is preferable that the projection screen can convert to visible rays from xrays, however it may convert them to ultraviolet rays or infrared rays. The preferable embodiment of the projection screen is a fluorescent screen that is comprised of an Xray-penetratable board and a fluorescent surface formed thereon by painting or the like fluorescent material. The image of the mark is shaded on the fluorescent surface.

The object is typically a pattern mask and may be a laser processor or other hole making apparatus for forming a via hole. The position adjustment of the invention is typically applied to the adjustment between the mask and the board in the aligners and may be applied to a via hole forming in the laser processor.

The invention can be reduced to practice as part of an aligner The aligner includes a photo mask having a pattern to be formed on the board as a conductive pattern. The photo mask is depicted with a mask mark and faces the board. Based on the mask mark and said mark imaged on the projection screen, the positioning between the photo mask and the board can be conducted by virtue of moving apparatus that moves either or both the board and the photo mask. After positioning, a light source exposes the pattern of the photo mask onto the board.

Image processing apparatus such as a CCD camera may be used to recognize the board mark and the mask mark overlapping each other. The camera does not have to be receivable of Xrays because the board mark projected on the projection screen has been changed to visible by natural light, or recognizable by infrared rays or ultraviolet rays.

In a preferred embodiment, the Xray irradiation device is positioned at the opposite side to the film- mask- facing side of the board. The projection screen is set between the photo mask and the board and it is detachable from the position so that the projection screen does not interfere with exposure by the light source.

The projection screen may be mounted on the mask at the mask mark position. In this case, the image of the mask and the image projected by Xrays are close, which makes the detection of overlapping the marks accurate. The projection screen mounted on the mask cannot be moved from the position. However, the projection screen will not be exposed when using negative resist for the pattern exposure. Then the photo resist film will be removed by developing and the copper foil around the area corresponding to the projection screen will be etched. That is advantageous for alignment in the following processes.

Said positioning can be adopted in laser processing apparatus for forming a via hole. By the positioning, the position of the pattern on the lower layer can be recognized and the accurately positioned via hole can be formed.

Further, the positioning can be adopted in drill apparatus for boring a hole in order to form highly accurate positioned holes.

DETAILED DESCRIPTION OF PREFERRED EMBODIMENTS

The invention will now be described in reference to the attached drawings.

Figure 1:
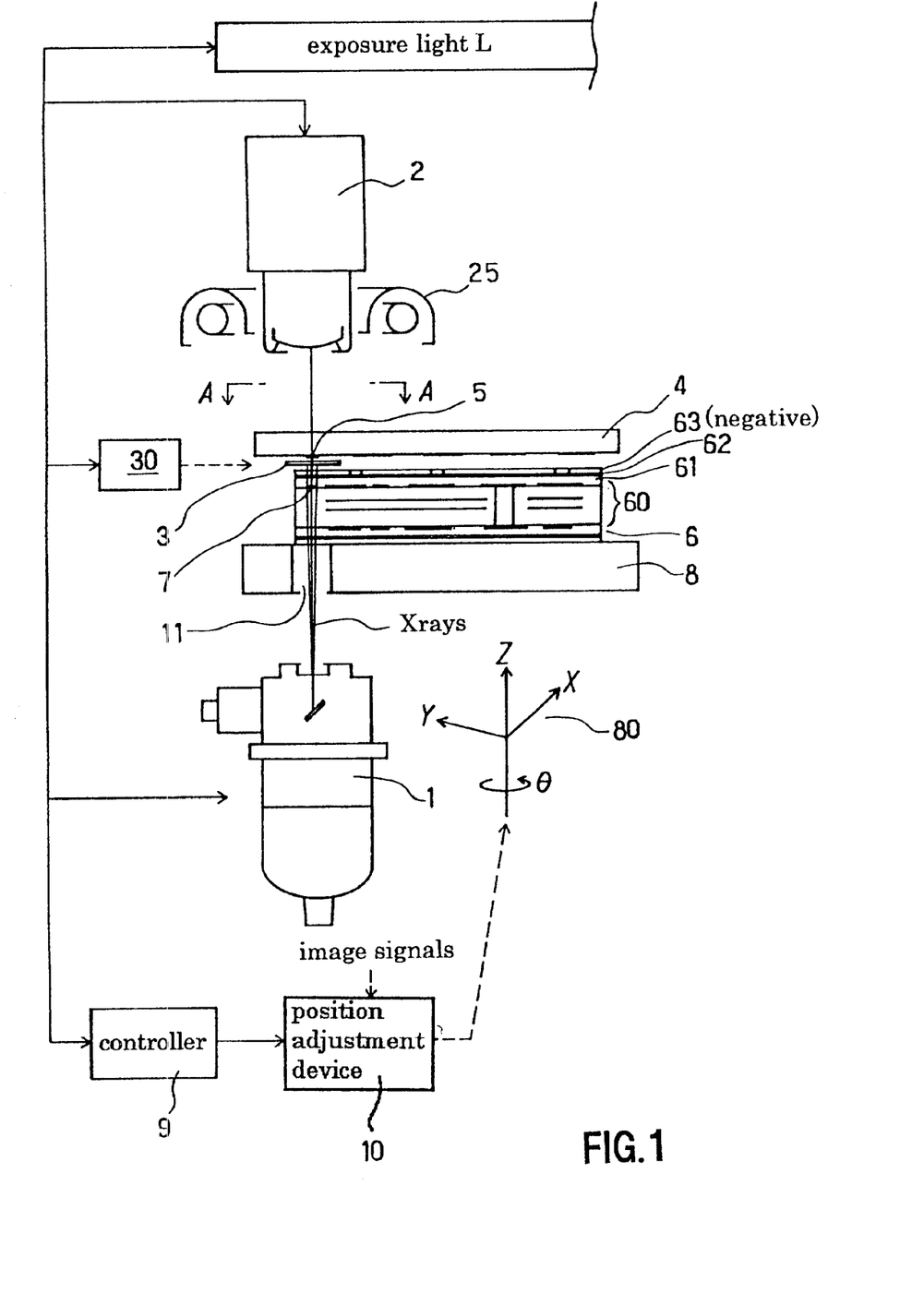
FIG. 1 is a schematic view of the aligner.

FIG. 1 shows an embodiment of an aligner. An exposure stage 8 is equipped with a moving device 80 and it is movable in the XYZ directions and rotatable in the θ direction so that a board 6 placed on the stage 8 can be moved to adjust the position in relation to a photo mask 4. The photo mask 4 may be adapted to be moved instead of the board 6 or both the photo mask 4 and the board 6 may be movable. FIG. 1 shows only the left half of the aligner although the same construction exists in the right. The number of the construction may be optionally increased.

FIG. 1 shows the status where a build up isolation layer 61 is formed on a core board 60 of the board 6, a build up copper foil 62 was provided thereon, then a photo resist layer 63 was formed on the build up copper foil 62 and the photo resist layer 63 is to be in exposure of the circuit pattern of the photo mask 4. The number of the layers is optional and the multiple layers can be formed on the backside of the core board 60 as well.

An exposure light L shines the exposing rays on the pattern of the photo mask 4 and a circuit pattern will be formed on the build up copper foil 62 by photo-etching. The build up copper foil 62 becomes the conductive layer. The same treatment is repeated to construct the multiple layered printed circuit board. The laminated layers are conductive to each other by a via hole (not shown in the figure).

The core board 60 is provided at the end portion with a board mark 7 made of a copper foil as an alignment mark. A mask mark 5 is depicted on the end portion of the photo mask 4 that is utilized together with the board mark 7 to adjust the photo mask 4 and the board 6 by coinciding the positions of the mask mark 5 and the board mark 7.

An Xray hole 11 is made on the exposure stage 8 at the portion corresponding to the board mark 7. An Xray irradiation device 1 is set under the X-rays hole 11 and at the opposite side of the board 6 is arranged a fluorescence screen 3 as the projection screen. The X-ray irradiation device 1 irradiates Xrays toward the neighborhood of the board mark 7 on the board 6 and the Xrays penetrate the layers of the board 6 to project the image of the board mark 7 on the fluorescence screen 3.

At the opposite side of the photo mask 4 to the fluorescence screen 3 is located a CCD camera 2 that takes the shape of the board mark 7 projected on the fluorescence screen 3 through the photo mask 4. Simultaneously it takes the image of the mask mark 5 depicted on the photo mask 4.

Figure 2:
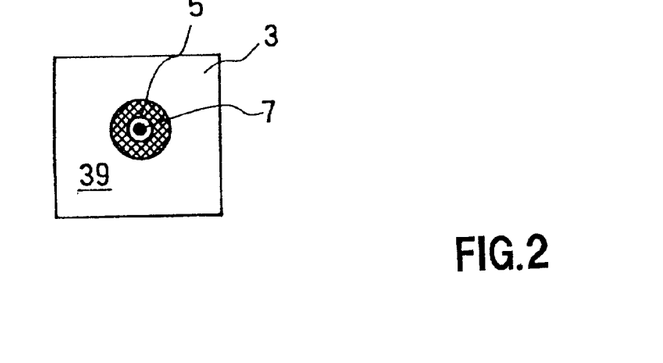
FIG. 2 is an explanatory view of the images on the fluorescence face 39.

FIG. 2 is the view in the A—A direction at FIG. 1 showing that the board mark 7 projected on a fluorescence face 39 of the fluorescence screen 3 and the mask mark 5 on the photo mask 4 are overlapping. The CCD camera 2 takes the image and transmits its signals to a position adjustment device 10.

An operator manipulates the position adjustment device 10, watching the image as in FIG. 2 to adjust the position of the board 6 by moving the exposure stage 8 via the moving device 80 so as to make the board mark 7 move, for example, into the center of the mask mark 5. By this operation, the positioning of the board 6 and photo mask 4 is achieved. Since the positioning for any layer is always conducted based on board mark 7, the layers will be formed precisely at the exact position without discrepancy and accumulation thereof.

The operation of the positioning using the position adjustment device 10 can be either automatic or manual by an operator seeing the image.

The fluorescence screen 3 made of an Xray-transparent material such as resin on which the fluorescence face 39 is formed by fluorescent paint, is set such that the board side of the fluorescence screen 3 faces Xray irradiation device 1 and the image of the board mark 7 is projected on the fluorescence face 39. The image on the fluorescence face 39 can be seen from the side of the photo mask 4. The Xrays from the Xray irradiation device 1 penetrates the board 6 and projects the shape of the board mark 7 onto the fluorescence face 39 where the Xrays are converted into visible rays to make the board mark 7 visible as a light and shade image. Since attenuation in the photo mask 4 of the visible rays from the fluorescence face 39 is rather smaller than Xrays, the CCD camera 2 can capture a cleaner image.

The projection screen may utilize other material that can convert X-rays to other rays, for example ultraviolet rays, infrared rays, etc., instead of the fluorescence screen 3 converting to visible rays.

The fluorescence screen 3 can be moved from between the photo mask 4 and the board 6 by a moving device 30 because the fluorescence screen 3 may interfere with the exposing rays from an exposure light L.

A controller 9 controls the exposure light L, the CCD camera 2, the moving device 30, the Xray irradiation device 1, the position adjustment device 10 and other parts of the device.

The CCD camera 2 is provided with a ring light 25 to conduct visible positioning.

The operation with the device explained above is as follows.

Before exposing the pattern of the photo mask 4 onto the board 6, the Xray irradiation device 1 is controlled to issue Xrays and project the board mark 7 onto the fluorescence screen 3. The image of the board mark 7 on the fluorescence screen 3 is taken through the photo mask 4 together with the mask mark 5, then the position adjustment device 10 controls the moving device 80 to adjust the position of the board 6 so as to coincide the board mark 7 and the mask mark 5.

After the adjustment, the fluorescence screen 3 and the CCD camera 2 are moved from the initial position to the predetermined refuge positions and the exposure stage 8 is moved toward the photo mask 4 to approximate the photo mask 4 to the board 6. Then the exposure light L is controlled to shine the exposure rays to expose the pattern depicted on the photo mask 4 onto a photo resist layer 63.

Said operation will be repeated to form a plurality of layers. The positioning of the invention mentioned above achieves the accurate adjustment of the positions of the photo mask 4 and the board 6 and accordingly the precise exposure will be accomplished.

Though only the board 6 moves in the embodiment explained above, only the photo mask 4 may move, and both the photo mask 4 and the board 6 may be movable.

Furthermore, though the board mark 7 is placed on the core board 60 in the embodiment, it can be positioned on any other layers and a plurality of the board marks 7 can be set on different layers respectively.

The positioning may be applied to a process for forming via holes.

Figure 3:
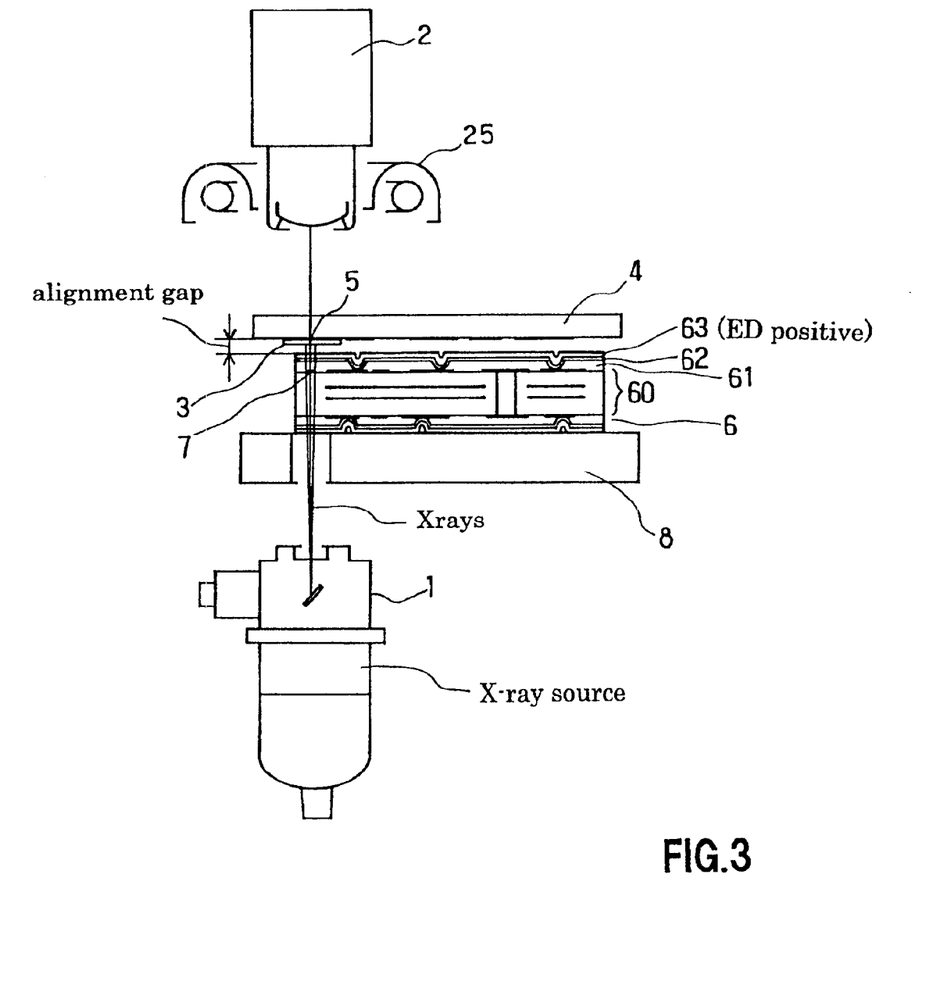
FIG. 3 is a schematic view of another embodiment of the aligner.

FIG. 3 shows another embodiment where the fluorescence screen 3 is adhered to the lower side facing the Xray irradiation device 1 of the photo mask 4. The fluorescence screen 3 covers the mask mark 5. Since the image of the board mark 7 on the fluorescence screen 3 and the image of the mask mark 5 are on almost the same level, the image detecting accuracy by the CCD camera 2 will be developed. The other parts in FIG. 3 are the same as in FIG. 1.

In order to keep the accurate exposure, it is preferred to correct the position of the Xray irradiation device 1 to delete parallax as follows.

The fluorescence screen 3 is moved, then the photo mask 4 is set and the core board 60 is placed on the exposure stage 8. The ring light 25 turns on and the positions of the mask mark 5 and the board mark 7 are adjusted as overlapping each other as shown in FIG. 2, seeing the images captured by the CCD camera 2 by moving the exposure stage 8 in the X, Y directions.

Then the fluorescence screen 3 is set after the exposure stage 8 is moved downward in order to make a larger gap between the photo mask 4 and the core board 60, in order to make parallax of the Xray irradiation device 1 emerge bigger. The Xray irradiation device 1 issues Xrays and the positions of the board mark 7 projected on the fluorescence screen 3 and the mask mark 5 are adjusted by moving the Xray irradiation device 1 instead of moving the exposure stage 8. Since the mask mark 5 and the board mark 7 were adjusted in the coincident position already, the projected board mark 7 and the mask mark 5 must become coincident when eliminating the parallax of the Xray irradiation device 1. Therefore, the position of the Xray irradiation device 1 can be corrected by moving it until the projected board mark 7 and the mask mark 5 come into the coincident position.

For the embodiment of FIG. 3 where the fluorescence screen 3 is adhered to the lower side and is unmovable, a second mask mark close to the mask mark 5 is depicted on the photo mask 4 and a second board mark is formed close to the board mark 7 as well. Then the positions of the second mask mark and the second board mark are adjusted as overlapping each other as shown in FIG. 2, seeing the images captured by the CCD camera 2 by moving the exposure stage 8 in the X, Y direction.

Then the exposure stage 8 is moved downward as well and the X-ray irradiation device 1 issues Xrays and adjust the positions of the board mark 7 projected on the fluorescence screen 3 and the mask mark 5 by moving the Xray irradiation device 1 instead of the exposure stage 8 until the board mark 7 and the mask mark 5 come into the coincident position.

Figure 4:
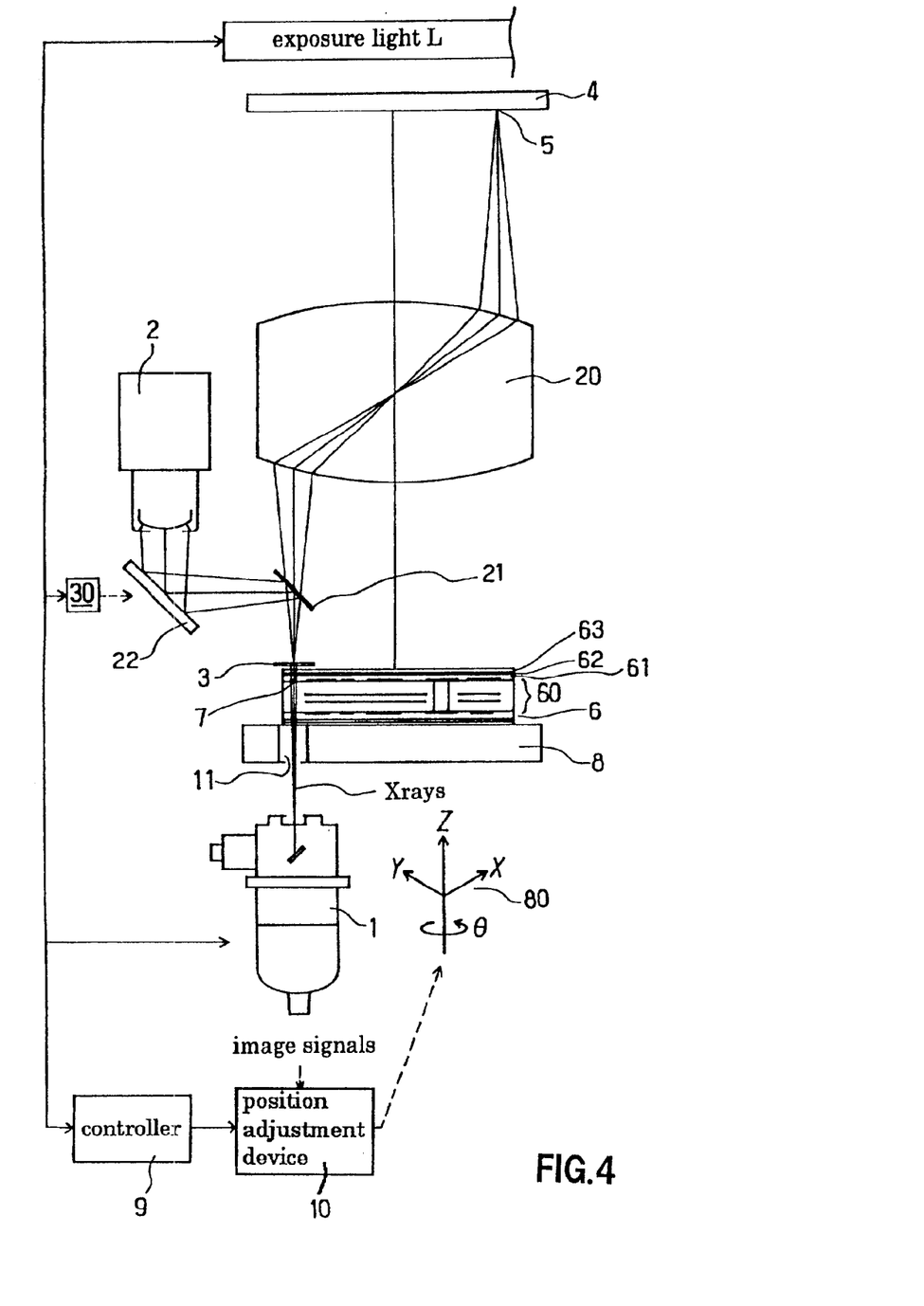
FIG. 4 is a schematic view of the projection aligner.

FIG. 4 shows an embodiment of a projection aligner where the mask mark 5 on the photo mask 4 is projected on the fluorescence screen 3 by a projection lens 20 through a pericle half mirror 21. The board mark 7 projected on the fluorescence screen 3 by the Xray irradiation device 1 and the mask mark 5 are imaged by the CCD camera 2, the pericle half mirror 21 and a reflection mirror 22.

The CCD camera 2, the fluorescence screen 3, the pericle half mirror 21 and the reflection mirror 22 are integrated in one component so as to be integrally movable by the moving device 30. The fluorescence screen 3 may be isolated from the component.

The same construction is installed on the opposite side, although only one is shown in the drawing. The number of the construction may be increased optionally.

Figure 5:
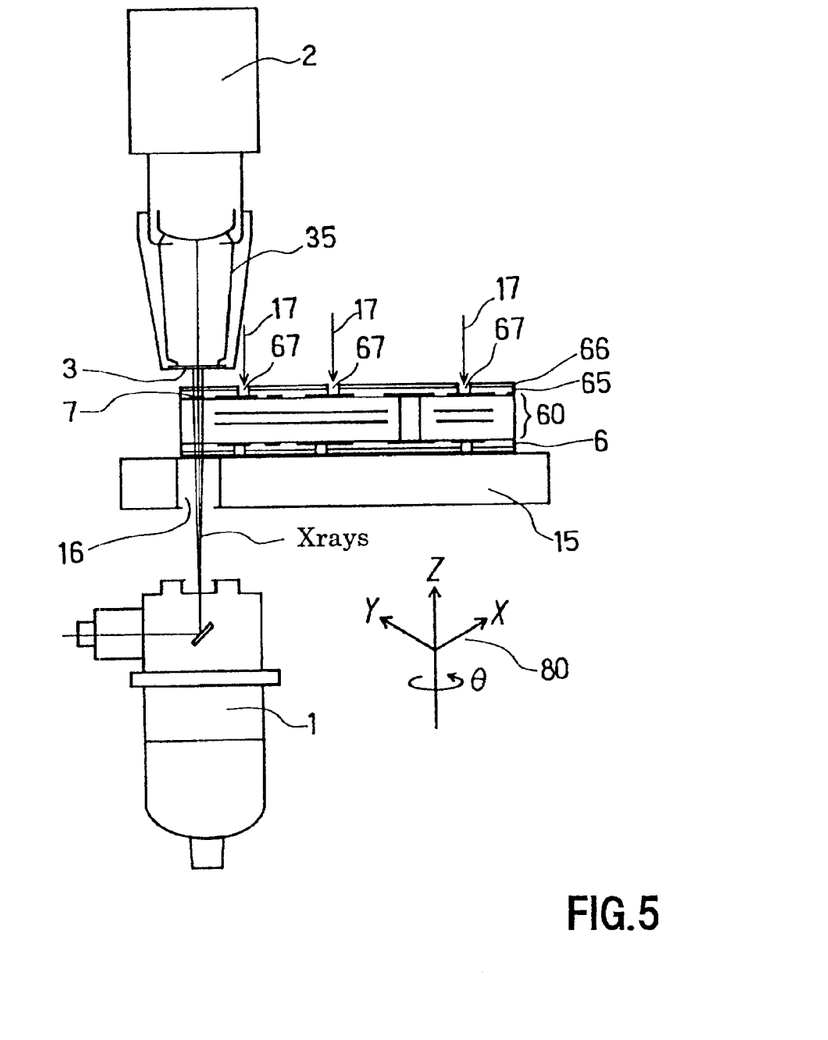
FIG. 5 is a schematic view of the laser processor.

The invention may be applied to a laser processor as shown in FIG. 5 for making a via hole on a circuit board by laser rays. A stage of the laser hole making device 15 movable in the directions of X,Y,Z, θ by moving device 80 is formed with an X-ray hole 16 under which is located the Xray irradiation device 1. The Xray irradiation device 1 irradiates Xray to the board mark 7 formed on the core board 60 of the board 6 placed on the stage of laser hole making device 15 and projects the image of the board mark 7 onto the fluorescence screen 3. The image of the board mark 7 captured by the CCD camera 2 is used to position the board 6. After the positioning, a via hole 67 is formed on an isolation layer 65 and a copper foil 66 by laser rays 17. The fluorescence screen 3 is supported by a fluorescence screen holder 35.

With this embodiment, the accurate via hole 67 can be formed.

Figure 6:
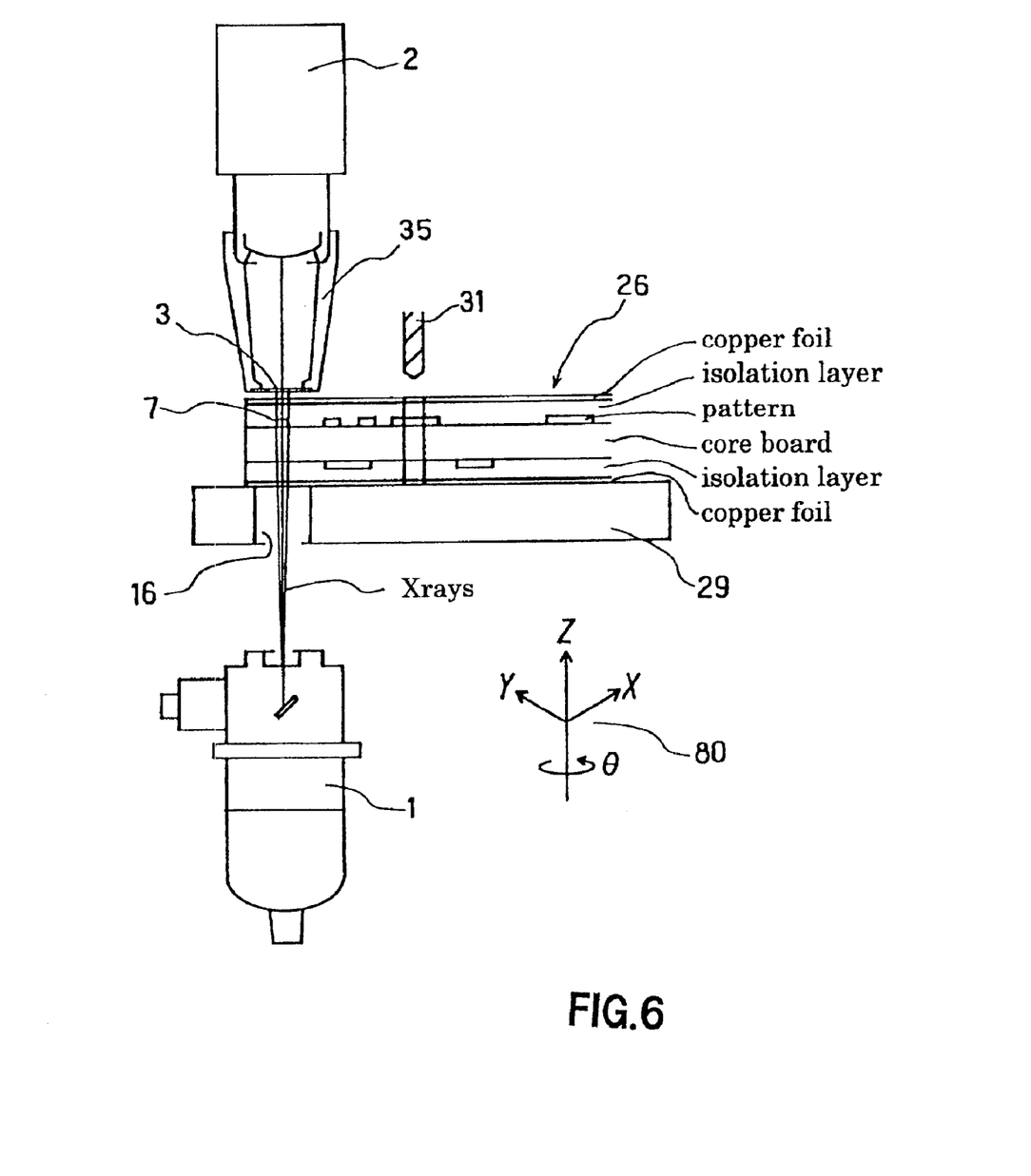
FIG. 6 is a schematic view of the drilling device.
Figure 7:
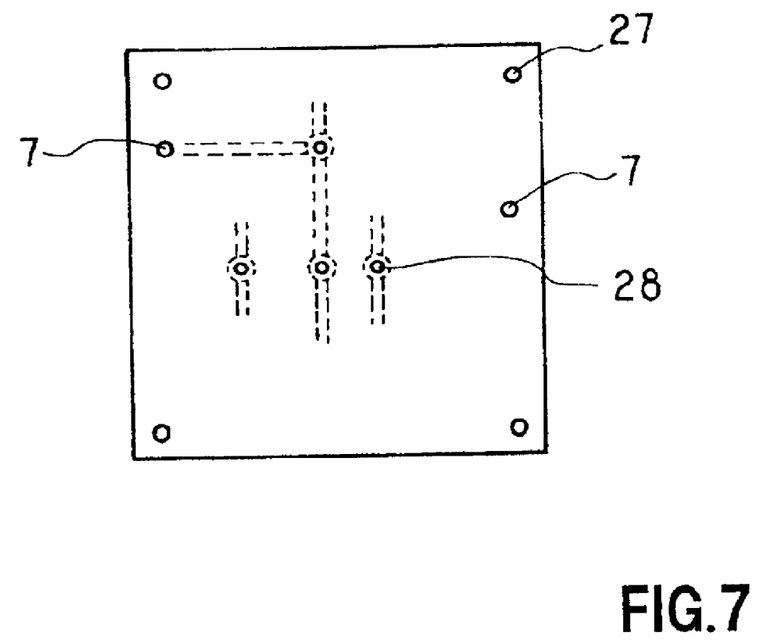
FIG. 7 is a plan view of the laminated printed circuit board 26.

FIG. 6 shows a drilling device of the invention used in a process of manufacturing a laminated printed circuit board for drilling a tooling hole and a through hole.

A stage of the hole making device 29 movable in the directions of X,Y,Z, θ by moving device 80 is formed with the Xray hole 16 under which is located the Xray irradiation device 1. The fluorescence screen 3 supported by the fluorescence screen holder 35 is movable with the CCD camera 2. The Xray irradiation device 1 irradiates to the board mark 7 formed on the core board 60 of a laminated printed circuit board 26 placed on the stage of laser hole making device 15 and projects the image of the board mark 7 onto the fluorescence screen 3. The image of the board mark 7 captured by the CCD camera 2 is used to position the laminated printed circuit board 26, followed by drilling the laminated printed circuit board 26 with a drill 31 to make a tooling hole 27 or a through hole 27.

With this embodiment, the accurate tooling hole 27 and the through hole 27 can be formed.

What is claimed is:

1. Apparatus for adjusting a position between a multi-layered printed circuit board that includes a plurality of insulated layers and a plurality of conductive layers having a conductive pattern and an object in a producing process of the multi-layers printed circuit board, comprising an invisible mark that can be imaged by Xrays formed on at least one of said layers of said multi-layered printed circuit board, means for irradiating Xrays on an area containing said mark, a projection screen that can convert Xrays to one of visible rays, ultra violet rays or infrared rays for projecting said mark irradiated by Xrays thereon, means for moving at least one of said multi-layered printed circuit board and said object based on said mark projected on said projection screen so as to adjust the relative position therebetween, a visible adjusting mark formed on said object, wherein said means for moving moves at least one of said multi-layered printed circuit board and said object based on said board mark projected on said projection screen and said visible adjusting mark so as to adjust the relative position between said board and said object, wherein said object is a photo mask.

2. Apparatus of claim 1 wherein: said projection screen is a fluorescent screen.

3. Apparatus of claim 1 wherein: said mark that can be imaged by Xrays is formed on a core board of the multi-layered printed circuit board.

4. Apparatus of claim 1 wherein: said means for irradiating X-rays comprises an X-ray irradiation device, and wherein the position of said Xray irradiation device is corrected before said positioning.

5. Apparatus of claim 4 wherein; said object is provided with a mark for positioning, said projection screen is movable, said board and said object are relatively positioned so as to place said mark formed on at least one of said layers of said multi-layered printed circuit board and said mark for positioning in a predetermined positioning relation under a visible condition after moving said projection screen to a refuge position, said Xray irradiation device is movable so as to place the projection shape of said mark formed on at least one of said layers on the projection screen that is movable back to a previous position and the mark for positioning in the predetermined positioning relation before said adjusting the relative position between the board and the object.

6. Apparatus of claim 3 wherein; said object is provided with visible first and second marks, the core board is provided with a visible second board mark, the relative position of said core board and said object are adjusted so as to place said second mark and said second board mark in the predetermined positioning relation under a visible condition, said Xray irradiation device is moved so as to place the projection shape of the board mark on the projection screen and the first mark in the predetermined positioning relation before said adjusting the relative position between the board and the object.

7. Apparatus of claim 4 wherein; the gap between the board and the object is increased when positioning the Xray irradiation device.

8. Apparatus for producing a multi-layered printed circuit board that includes a plurality of insulated layers and a plurality of conductive layers having a conductive pattern, comprising; a photo mask facing one side of a board on which multi-layered printed circuits will be formed, the photo mask having a pattern for a conductive circuit to be formed on the board, an invisible board mark that can be imaged by Xrays formed on at least one of said layers of said multi-layered printed circuit board, a visible mask mark formed on said photo mask, means for irradiating Xrays on an area containing said board mark, a projection screen that can convert Xrays to one of visible rays, ultra violet rays or infrared rays for projecting said mark thereon irradiated by Xrays, means for moving at least one of said multi-layered printed circuit board and said photo mask based on said board mark projected on said projection screen and said visible mask mark so as to adjust the relative position between said board and said photo mask, a projection light source shining said pattern of said photo mask onto said board.

9. Apparatus of claim 8, further comprising; an image recognition means for recognizing said mask mark of the photo mask and said board mark projected on the projection screen, wherein said means for moving moves at least one of said board and said photo mask so as to make said mask mark and said board mark positioned in a certain relation.

10. Apparatus of claim 8, wherein; said means for irradiating Xrays is located at the side of said board other than the side facing the photo mask, said projection screen is set between said board and said photo mask and movable from between them.

11. Apparatus of claim 8, wherein; said projection screen is mounted on said photo mask.

12. Apparatus of claim 8 further comprising; a projecting lens for projecting said pattern of said photo mask, wherein said projection light source projects said pattern of said photo mask via said projecting lens onto said board.

13. Apparatus of claim 8 wherein; said projection screen is a fluorescent screen.

14. A method for adjusting a position of a multi-layered printed circuit board that includes a plurality of insulated layers and a plurality of conductive layers having a conductive pattern in a producing process of the multi-layered printed circuit board including the steps of forming a conductive pattern by using an aligner and forming a visible mark for position adjustment on a photo mask of the aligner, comprising the steps of:

forming an invisible mark that can be imaged by Xrays on at least one of said layers of said multi-layered printed circuit board, irradiating Xrays on an area containing said mark and projecting said mark on a projection screen that can convert Xrays to one of visible rays, ultra violet rays or infrared rays, detecting a position of said multi-layered printed circuit board based on said mark projected; and adjusting the position of said multi-layered printed circuit board and said photo mask by said visible mark for position adjustment and said mark projected on said projection screen.

15. The method of claim 14; wherein said producing process of the multi-layered printed circuit board comprises the steps of forming a via hole between layers of said multi-layered printed circuit board by using a laser processor, said adjustment includes the step of adjusting the position of said multi-layered printed circuit board and said laser processor based on said mark projected on said projection screen.

16. The method of claim 14 wherein: said projection screen is a fluorescent screen.

* * * * *